United States Patent
Takiguchi et al.

(10) Patent No.: US 9,944,002 B2
(45) Date of Patent: Apr. 17, 2018

(54) POSITION DETECTOR APPARATUS

(71) Applicant: DENSO CORPORATION, Kariya, Aichi-pref. (JP)

(72) Inventors: Tomoyuki Takiguchi, Okazaki (JP); Ninh Duc Hoang, Nagoya (JP); Yoshiyuki Kono, Obu (JP); Takehito Mizunuma, Chiryu (JP)

(73) Assignee: DENSO CORPORATION, Kariya (JP)

( * ) Notice: Subject to any disclaimer, the term of this patent is extended or adjusted under 35 U.S.C. 154(b) by 280 days.

(21) Appl. No.: 14/470,387

(22) Filed: Aug. 27, 2014

(65) Prior Publication Data

US 2015/0061657 A1    Mar. 5, 2015

(30) Foreign Application Priority Data

Aug. 28, 2013  (JP) ................................. 2013-176868
Sep. 20, 2013  (JP) ................................. 2013-194922
Apr. 21, 2014  (JP) ................................... 2014-87316

(51) Int. Cl.
   *B29C 45/14*    (2006.01)
   *G01D 5/14*     (2006.01)
   (Continued)

(52) U.S. Cl.
   CPC ........ *B29C 45/14655* (2013.01); *F02D 41/28* (2013.01); *G01D 5/145* (2013.01);
   (Continued)

(58) Field of Classification Search
   CPC .... B29C 45/14655; B29C 2045/14672; B29K 2905/00; B29K 2995/0097;
   (Continued)

(56) References Cited

U.S. PATENT DOCUMENTS 5,637,995 A    6/1997  Izawa et al.
6,407,543 B1   6/2002  Hagio et al.
(Continued)

FOREIGN PATENT DOCUMENTS

JP    2000-61990    2/2000
JP    2004-233103   8/2004
(Continued)

OTHER PUBLICATIONS

Machine translation of Japanese patent JP 5234522 B2 for Japanese application JP 2011069617 A to Ichiki et al., accessed Oct. 24, 2016 from https://worldwide.espacenet.com/publicationDetails/description?CC=JP&NR=5234522B2&KC=B2&FT=D&ND=1&date=20130710&DB=&locale=.*
(Continued)

*Primary Examiner* — Patrick Assouad
*Assistant Examiner* — Khristopher Yodichkas
(74) *Attorney, Agent, or Firm* — Nixon & Vanderhye P.C.

(57) ABSTRACT

A position detector apparatus includes a detector part, wiring, a resin part, a resin body, a terminal, and a lead frame. The resin part has a thickness at a wiring side portion of the detector part that is greater than a thickness on a side opposite to the wiring side portion. Therefore, when injection-molding the resin part, due to a thickness change of the resin part, the detector part is pressed against a metal mold and a position of the detecting part is fixed. Further, the resin body has a thick-resin portion and a thin-resin portion. The thickness of the thin-resin portion allows a predetermined amount of dislocation of the detector part. Therefore, if the detector part is exposed, water is prevented from intruding the lead frame and the terminal.

11 Claims, 17 Drawing Sheets

(51) Int. Cl.
*F02D 41/28* (2006.01)
*G01R 33/07* (2006.01)
*B29L 31/34* (2006.01)

(52) U.S. Cl.
CPC .... *G01R 33/07* (2013.01); *B29C 2045/14672* (2013.01); *B29K 2905/00* (2013.01); *B29K 2995/0097* (2013.01); *B29L 2031/3406* (2013.01); *F02D 2200/0404* (2013.01)

(58) Field of Classification Search
CPC ............. B29L 2031/3406; F02D 41/28; F02D 2200/0404; G01D 5/145; G01R 33/07
USPC ................................................... 324/207.25
See application file for complete search history.

(56) References Cited

U.S. PATENT DOCUMENTS

| | | |
|---|---|---|
| 2002/0130656 A1 | 9/2002 | Hagio et al. |
| 2003/0001566 A1 | 1/2003 | Tsuge et al. |
| 2004/0135574 A1 | 7/2004 | Hagio et al. |
| 2012/0306484 A1 | 12/2012 | Mizutani et al. |
| 2013/0141086 A1 | 6/2013 | Takasaki et al. |
| 2014/0077794 A1 | 3/2014 | Takiguchi et al. |

FOREIGN PATENT DOCUMENTS

| | | | |
|---|---|---|---|
| JP | 2005-30941 | | 2/2005 |
| JP | 2011-069617 | | 4/2011 |
| JP | 2011069617 A | * | 4/2011 |
| JP | 2012-083124 | | 4/2012 |
| JP | 5234522 B2 | * | 7/2013 |

OTHER PUBLICATIONS

Office Action (4 pages) dated Jul. 30, 2015 issued in corresponding Japanese Application No. 2013-194922 and English translation (4 pages).

Office Action (5 pages) dated Feb. 9, 2016, issued in corresponding Japanese Application No. 2014-087316 and English translation (3 pages).

Office Action (5 pages) dated Aug. 4, 2015, issued in corresponding Japanese Application No. 2014-087316 and English translation (4 pages).

* cited by examiner

POUR

POSITION DETECTOR APPARATUS

CROSS REFERENCE TO RELATED APPLICATION

The present application is based on and claims the benefit of priority of Japanese Patent Applications No. 2014-87316, filed on Apr. 21, 2014 and No. 2013-176868, filed on Aug. 28, 2013, as well as No. 2013-194922, filed on Sep. 20, 2013, the disclosures of which are incorporated herein by reference.

TECHNICAL FIELD

The present disclosure generally relates to a position detector apparatus, a mold for manufacturing the position detector apparatus, and a method for manufacturing the position detector apparatus using the mold.

BACKGROUND INFORMATION

Conventionally, a position detector apparatus may be used to detect a rotation angle of a throttle valve of an electric-control throttle apparatus, a rotation angle of an accelerator pedal in an accelerator pedal module, or a stroke amount of a clutch actuator.

For example, a patent document 1 (i.e., Japanese Patent No. 4367473) discloses an electric-control throttle apparatus, which uses a position detector apparatus for detecting a rotation angle of a throttle valve. The position detector apparatus has dual Hall ICs that function together as a detector element for detecting a magnetic field of a magnet that is disposed on an end of a rotation shaft of a throttle valve. The position detector apparatus used in such an electric-control throttle apparatus is a resin-molded product, which molds the wiring extending from the two detector elements and a terminal connected thereto together with the respective detector elements as a pre-assembly part or a first pre-assembly module. Such a position detector apparatus is resin-molded together with a soldered terminal that is soldered to the above-described terminal to be installed in a housing cover of the electric-control throttle apparatus.

The position detector apparatus to be used in various products as described above may be installed in a single detector product or may be installed in a dual detector product.

Therefore, by preparing the position detector apparatus as a single detector first pre-assembly module that resin-molds only one detector element, such a single detector first pre-assembly module may be used in both of the single detector product and the dual detector product. In such a case, the position detector apparatus is preferably made as a resin-molded product in which the detector element, the wiring, and the terminal are resin-molded together, to improve the rigidity of the molded product.

However, when one detector element is resin-molded together with the wiring and the terminal, a dynamic pressure of the melted resin that is injected into the mold during injection molding may be applied to the detector element, which may result in a dislocation of the detector element in the mold during the injection molding and cause a faulty pre-assembly module that has the detector element dislocated in a resin part of the module.

Further, the patent document 1 discloses an electric-control throttle apparatus, which uses a position detector apparatus for detecting a magnetic field of a magnet that is disposed on an end of a rotation shaft of a throttle valve, for detecting a rotation angle of such throttle valve.

The position detector apparatus is a resin molded product, which molds a Hall IC and a terminal soldered onto a lead frame of the Hall IC, to form a first pre-assembly module. Such a position detector apparatus is further molded from resin to make a secondary pre-assembly module, i.e., a one-body combination of (i) the first pre-assembly module and (ii) a housing cover of the electric-control throttle apparatus.

Generally, in the position detector apparatus, a very thin resin wall is molded around the Hall IC to form the first pre-assembly module. In such manner, the position accuracy of the Hall IC against the outer wall of the first pre-assembly module is guaranteed.

However, when the first pre-assembly module is molded by injection molding, the position of the Hall IC may be dislocated from an intended position in an inside of a metal mold, and such a dislocation of the Hall IC may lead to an exposure of a portion of the Hall IC beyond the resin wall of the first pre-assembly module, due to a contact or a closeness of the dislocated Hall IC to an inner wall of the metal mold. In a worst case scenario, water or a liquid intruding into an inside of the first pre-assembly module from a Hall IC exposure part may corrode the lead frame and/or the terminal of the Hall IC and may deteriorate the position detection accuracy of the position detector apparatus.

SUMMARY

It is an object of the present disclosure to provide a position detector apparatus that prevents a dislocation of a detector element in a resin part of the position detector apparatus.

It is another object of the present disclosure to provide a position detector apparatus with improved position detection accuracy.

In an aspect of the present disclosure, a position detector apparatus in which at least one face of a detector part and a wiring extending therefrom are molded by resin is characterized in that resin thickness above the detector part is thicker on a wiring side than on an opposite side that is away from the wiring. The position detector apparatus includes a detector part having an element for detecting magnetism, wiring extending from the detector part, and a resin part molding at least one face of the detector part with the wiring. A thickness of resin mold at a wiring side portion on the at least one face of the detector part is greater than a thickness of the resin mold on a side opposite to the wiring side portion on the at least one face of the detector part.

In such manner, when the resin part is injection-molded, melted resin flowing from the wiring side toward the opposite side (i.e., opposite-to-wiring side) applies pressure on the at least one face of the detector part due to the thickness change of the mold. Therefore, by abutting the other face of the detector part on the mold for the injection molding, the detector part is stationarily positioned at an intended position. That is, the dislocation of the detector part away from an intended position in the resin part is prevented during the injection molding process.

Further, the position detector apparatus also includes an opposite face of the detector part that is opposite to the at least one face, the opposite face being at least partially exposed from the resin part.

Additionally, the position detector apparatus includes a thin molded portion of the resin part that molds the detector part, and a slope portion that is formed as an angled surface between the thick molded portion and the thin molded portion and positioned at a side opposite to a terminal of the detector part. The slope portion slopes toward the thin molded portion and reduces a mold thickness of the thin molded portion relative to the thick molded portion.

A connection part where the slope portion connects to the thin molded portion is positioned at the side opposite to the terminal of the detector part.

The slope portion may be symmetric relative to a center axis of the detector part.

The opposite face of the detector part is exposed from the resin part and abuttable with a metal mold that is used to injection mold the resin part.

The resin part is formed by injection molding a melted resin from the wiring side portion of the detector part to the side opposite to the wiring side portion of the detector part.

Throughout the present disclosure, "above the detector part" and "above one face among others" indicates a situation where the detector part itself or the at least one face of the detector part is "covered" by material such as a resin, and such covering does not necessarily mean a covering from above with respect to gravity but, rather, an attachment of something for the covering of the face.

In another aspect of the present disclosure, a metal mold is used for an injection molding of the position detector apparatus. The metal mold is configured to have a melted resin injected into a surrounding space around the at least one face of the detector part and the wiring. The metal mold includes a large capacity cavity forming a thick molded portion of the resin part that molds the wiring, and a small capacity cavity forming a thin molded portion of the resin part that molds the detector part. In such manner, when the resin part is injection-molded, the melted resin flowing from the large capacity cavity toward the small capacity cavity applies pressure on one face of the detector part due to the change of cavity volumes and thickness. Therefore, due to such pressure that causes an abutment of the other face of the detector part to the metal mold, the detector part is stationarily positioned at an intended position in the mold. That is, the dislocation of the detector part away from an intended position in the resin part during the injection molding is prevented by such structure of the metal mold. The metal mold for injection molding also includes an abutment part that is abuttable with an opposite face of the detector part which is opposite to the at least one face of the detector part.

Additionally, the metal mold for injection molding includes an injection passage fluidly connected to the surrounding space, disposed on a large volume cavity side of the surrounding space, and receiving the melted resin.

In yet another aspect of the present disclosure, a manufacturing method for manufacturing the position detector apparatus is described. In the manufacturing method, after positioning the detector part and the wiring in the metal mold, the melted resin is injected into the metal mold so that the melted resin flows from the large volume cavity to the small volume cavity.

In such manner, the pressure of the melted resin is applied to the one face of the detector part. Thus, by abutting the other face of the detector part on the metal mold, the detector part is stationarily positioned at an intended position. That is, the dislocation of the detector part away from an intended position in the resin part during the injection molding is prevented by this manufacturing method.

In still yet another aspect of the present disclosure, the position detector apparatus having a detector part and a terminal that is resin-molded by a resin body includes, as a part of the resin body, a side opposite to the terminal, a thick-resin portion that molds a terminal end of the detector part, which is an end of the detector part that is closer to the terminal than the semiconductor element, and a thin-resin portion that molds an end opposite to the terminal end of the detector part. In other words, the thick-resin portion molds a terminal end of the detector part which is an end of the detector part that is closer to the terminal than the semiconductor element, and the thin-resin portion molding an end opposite to the terminal end of the detector part. The resin body is a first pre-assembly molded component. That is, the resin body is molded prior to assembly of the position detector apparatus.

The thin-resin portion has a thickness that allows a predetermined amount of dislocation of the detector part.

The thin-resin portion has a thickness that prevents exposure of the detector part when a position of the detector part is dislocated by the predetermined amount of dislocation.

The detector part has an exposed metal portion that is set at a position that is different from a partially-exposed position of the lead frame. The thin-resin portion is positioned further away from the terminal end than the exposed metal portion. The thick-resin portion is positioned on the terminal end of the detector part and covers the exposed metal portion.

The resin frame of the detector part has a first face and a second face respectively disposed in parallel with the lead frame, a third face that is positioned on a lead frame projecting side, a fourth face that is positioned on a side opposite to the third face, and a fifth face and a sixth face that respectively connect the first face and the second face and have the exposed metal portion positioned thereon. The thin-resin part and the thick-resin part are disposed on the fifth face and on the sixth face.

In such a structure of the position detector apparatus, when the resin body has the thin-resin portion, a dislocation of the detector part in an inside of the thin-resin portion is contained within an allowable tolerance (i.e., within a predetermined amount of dislocation). Further, when the resin body has the thick-resin portion, intrusion of water and the like into an inside of the first pre-assembly module to reach the lead frame and the terminal is prevented. Therefore, the position detection accuracy of the position detector apparatus is improved.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Embodiments of the present disclosure are described based on the drawings.

First Embodiment

A position detector apparatus in the first embodiment of the present disclosure is described with reference to FIGS. 1-7. A position detector apparatus 1 is attached to a housing cover 11 of an electronically controlled throttle 10 which controls the air volume entering into the cylinder of a vehicle engine.

Figure 1:
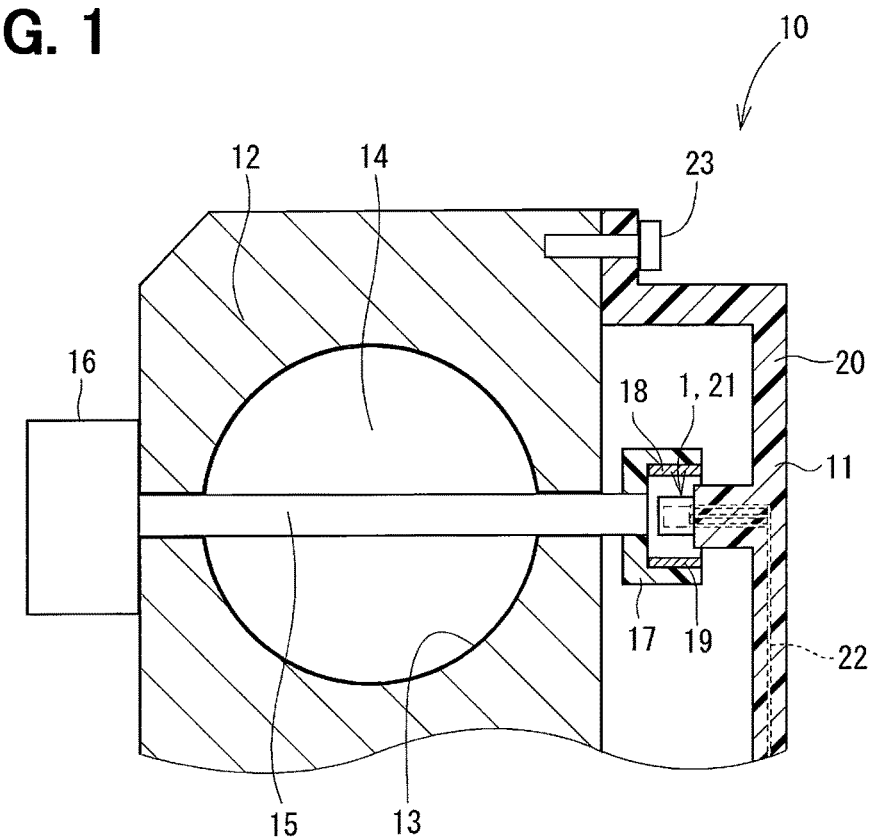
FIG. 1 is a cross section of an electric-control throttle apparatus having a position detector apparatus in a first embodiment of the present disclosure.

The outline configuration of the electronically controlled throttle 10 is described. As shown in FIG. 1, a suction passage 13 which introduces air into an engine is formed in a housing 12 of the electronically controlled throttle 10.

A throttle valve 14 formed in an approximate flat circular shape is formed in the suction passage 13. Both ends of a valve shaft 15 on which the throttle valve 14 is attached is pivotally supported by the housing 12. Thereby, the throttle valve 14 is pivotable about the center of the valve shaft 15 that serves as the axis of rotation.

A motor 16 is attached to one end of the valve shaft 15. The motor 16 is controllably driven by an instruction from an electrical control unit (ECU) of the engine which is not illustrated. When the motor 16 is driven for controlling an opening of the throttle valve 14, an amount of air volume supplied to the engine is adjusted.

A cup-shape holder 17 is formed on the other end of the valve shaft 15. On an inner wall of the cup-shape holder 17, two magnets 18, 19 serve as a magnetic field generators. The two magnets 18, 19 are connected circumferentially by two yokes (non-illustrated). The magnets 18, 19 are disposed to face each other symmetrically around the rotation shaft of the throttle valve 14, and provide one of two yokes an N pole magnetic flux and the other of the two yokes an S pole magnetic flux. Such a structure is configured to flow a magnetic flux from one yoke to the other yoke in an inside of the holder 17, thereby generating a magnetic field that in turn causes a magnetic flux to flow substantially perpendicularly to the rotation shaft of the throttle valve 14. When the throttle valve 14 rotates, a direction of the magnetic field in an inside of the holder 17 changes.

The housing cover 11 is attached on a holder side of the housing 12.

The housing cover 11 includes a cover body 20, a rotational angle sensor 21, a terminal 22, etc. The cover body 20 resin-molds a terminal side of the rotational angle sensor 21 and the terminal 22.

The rotational angle sensor 21 of the present embodiment is a combination of two position detector apparatuses 1 which are first pre-assembly modules. The rotational angle sensor 21 is positioned in an inside of the magnetic field in the holder 17, and outputs a voltage signal according to the magnetic flux density of the magnetic field which passes through the rotational angle sensor 21 This signal is transmitted to the ECU through the terminal 22. The ECU controls each part of the vehicle.

Figure 2:
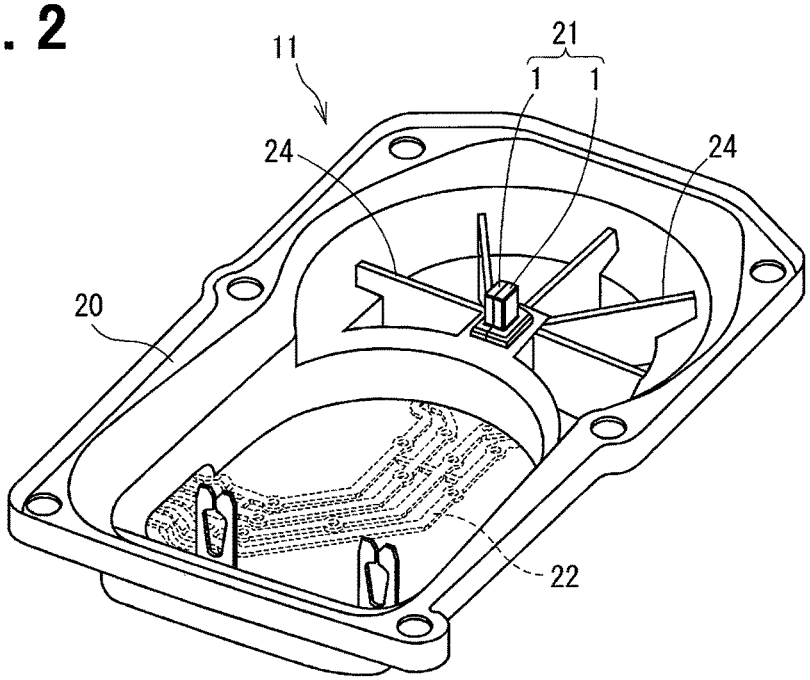
FIG. 2 is a perspective view of a housing cover of the electric-control throttle apparatus having the position detector apparatus in the first embodiment of the present disclosure.

As shown in FIGS. 1 and 2, the housing cover 11 is formed in a dish shape with resin, and is fixedly attached to the housing 12 by, for example, a screw-thread 23 and the like. The cover body 20 is a secondary pre-assembly module made up by a resin-molding of the rotational angle sensor 21, which is a combination of the two position detector apparatuses 1, and the terminal 22. On the housing cover 11, there are many ribs 24 disposed for the improvement of the rigidity.

Figure 3:
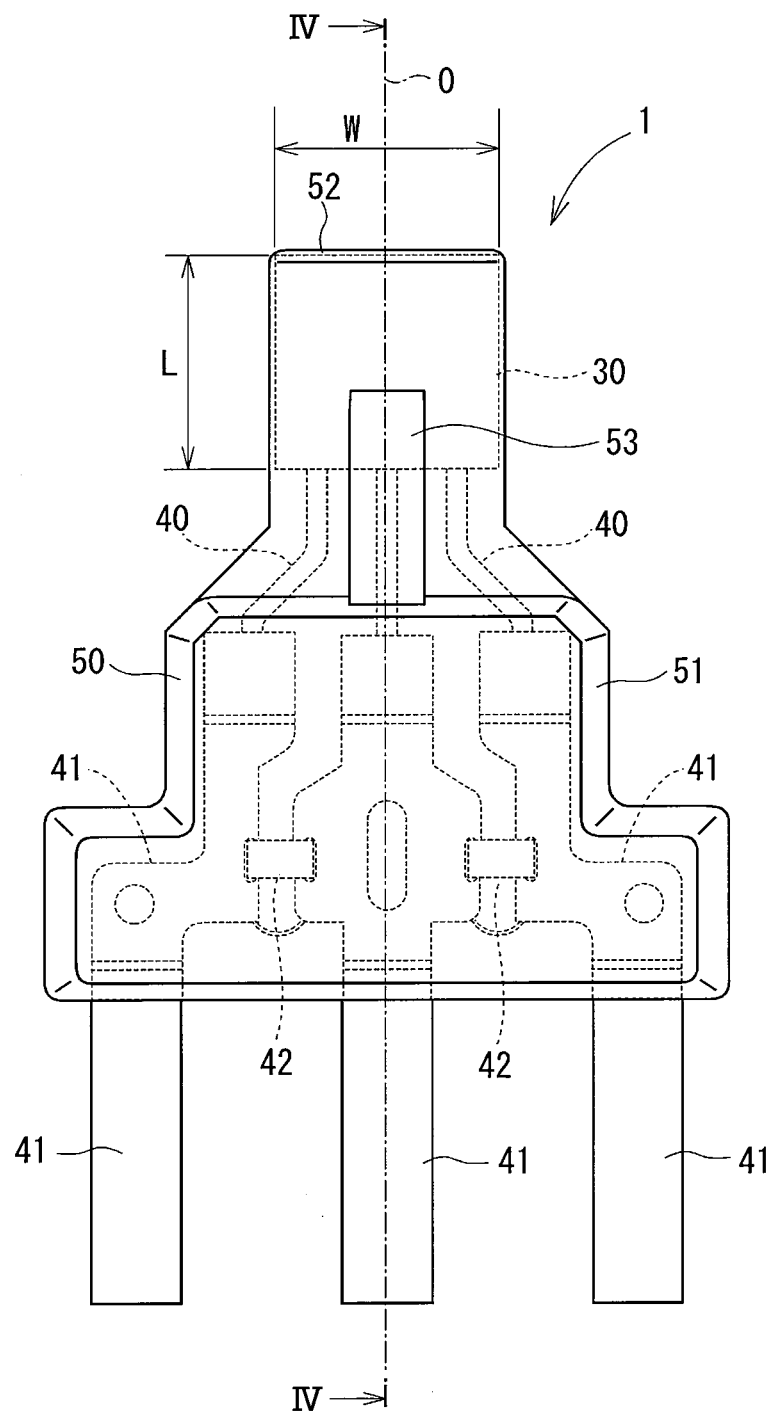
FIG. 3 is a plan view of the position detector apparatus in the first embodiment of the present disclosure.
Figure 4:
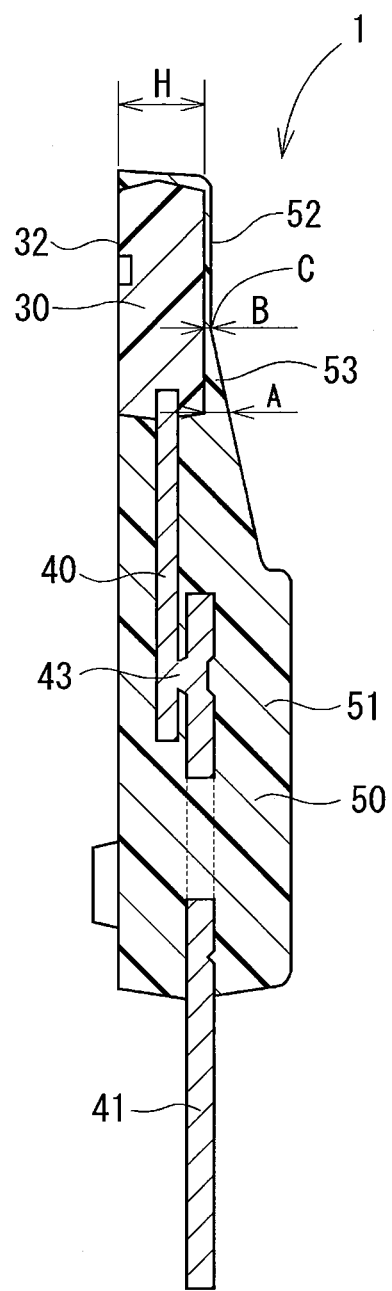
FIG. 4 is a cross section of the position detector apparatus along a IV-IV line in FIG. 3.

As shown in FIGS. 3 and 4, the position detector apparatus 1 is provided with a detecting element 30, a wiring 40, a terminal 41, a capacitor 42, and a resin part 50 together with other parts.

The detecting element 30 is a Hall IC which is, for example, a one-body resin-molded part of a Hall element that detects magnetism and a signal amplifying circuit.

The wiring 40 is a lead wire that has its one end electrically connected to the Hall element and the signal amplifying circuit which are included in the detecting element 30 and has its other end extending from the detecting element 30.

The terminal 41 has its convex part 43 on one end electrically soldered to the wiring 40, and has its other end extending from the resin part 50.

The resin part 50 molds one face 31 of the detecting element 30 as well as molding four connecting faces that are respectively connected to four sides of the one face 31 and further molding the wiring 40 and the terminal 41. An other face 32 that is an opposite face opposite to the one face 31 of the detecting element 30 is exposed from the resin part 50. The other face 32 of the detecting element 30 is abuttable to a metal mold 60 that is used for the injection molding of the resin part 50.

The detecting element 30 has the one face 31 and the other face 32 formed in parallel with the Hall element that is molded therein. Therefore, the detecting element 30 detects the magnetic flux piercing therethrough from the one face 31 to the other face 32 or the magnetic flux reversely piercing therethrough from the other face 32 to the one face 31. Thus, the one face 31 and the other face 32 of the detecting element 30 are magnetic detecting faces which can detect magnetism.

As for a dimension of the detecting element 30, a distance H between the one face 31 and the other face 32 is formed smaller than a width W and a length L of the one face 31. Therefore, the detecting element 30 has a flat shape. By having such a shape, the detecting element 30 can detect the magnetic flux piercing therethrough (i.e., the detecting element 30) highly accurately.

The resin part 50 has a thick molded portion 51, a thin molded portion 52, and a slope portion 53.

The thick molded portion 51 molds the wiring 40 and the terminal 41. The thin molded portion 52 molds a detector part side of the thick molded portion 51.

The slope portion 53 is formed as a slope (i.e., angled surface), which extends from a connection part connecting the thick molded portion 51 and the thin molded portion 52 toward a connection part C that is positioned above the one face 31 of the detecting element 30. The connection part C where the slope portion 53 and the thin molded portion 52 connect may be positioned closer to an opposite side end (i.e., on a side opposite to the wiring side portion) of the detecting element 30 than a wiring side end of the element 30.

According to the present embodiment, the connection part C where the slope portion 53 and the thin molded portion 52 connect is positioned above the one face 31 of the detecting element 30. According to the present embodiment, the thin molded portion 52 and the slope portion 53 thicker than the thin molded portion 52 are positioned above the one face 31 of the detecting element 30.

A thickness B of the slope portion 53 on the opposite side of the detecting element 30 is thinner than a thickness A of the slope portion 53 on the wiring side of the detecting element 30. In other words, the slope portion slopes toward the thin molded portion and reduces a mold thickness of the thin molded portion relative to the thick molded portion. Further, the slope portion 53 is symmetric (i.e., laterally from right to left) relative to a center axis O of the detecting element 30.

The resin part 50 is formed by an injection molding of, for example, thermosetting resin. The resin part 50 is formed with the injection molding by flowing a melted resin from the wiring side of the detecting element 30 toward the opposite-to-wiring side, which is thermoset after flowing therethrough.

Figure 5:
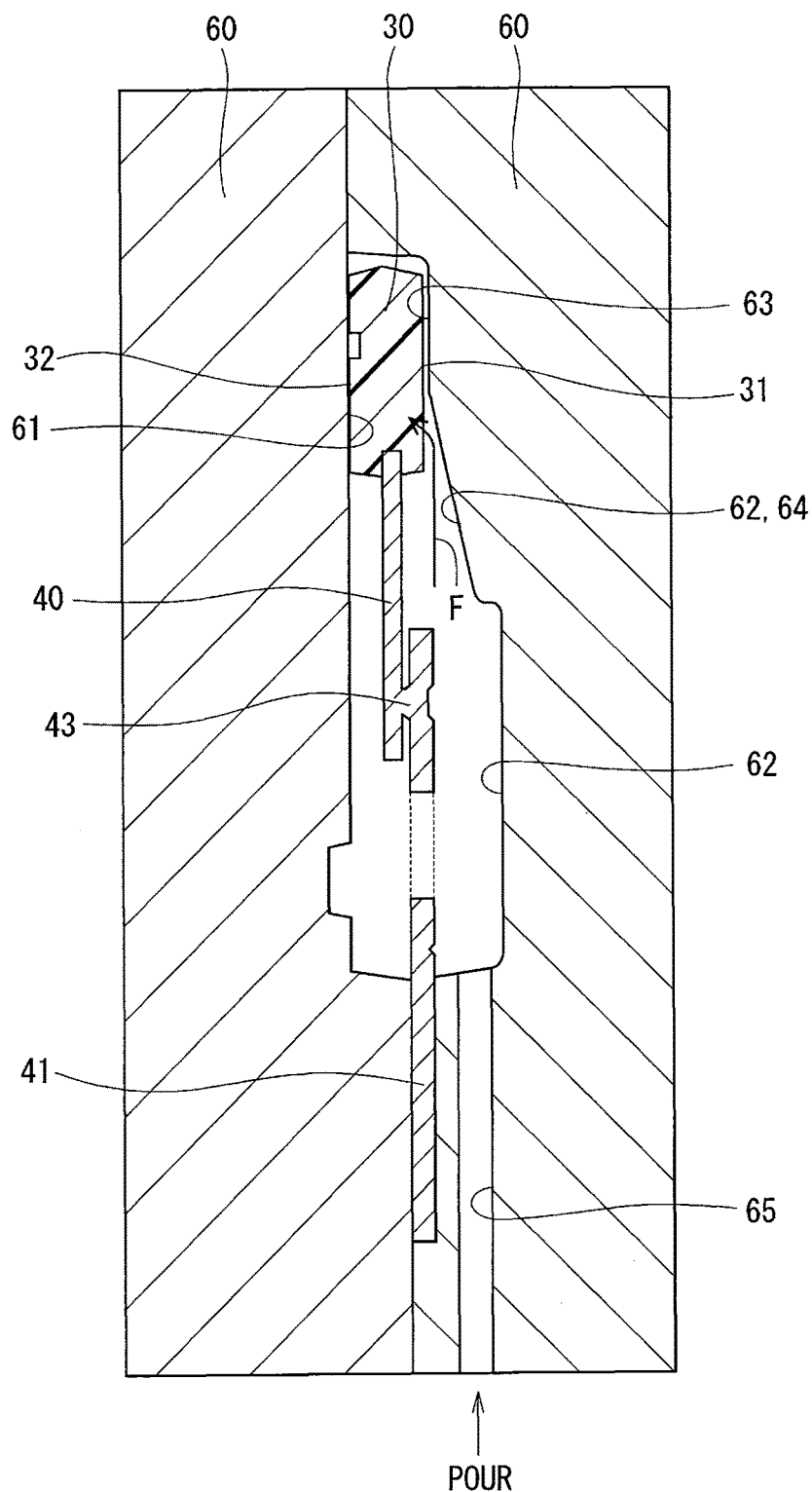
FIG. 5 is a cross section of a metal mold used for an injection molding of the position detector apparatus in the first embodiment of the present disclosure.

Next, a manufacturing method of the position detector apparatus 1 is described with reference to illustrations of FIGS. 5, 6 and a flowchart of FIG. 7.

Figure 7:
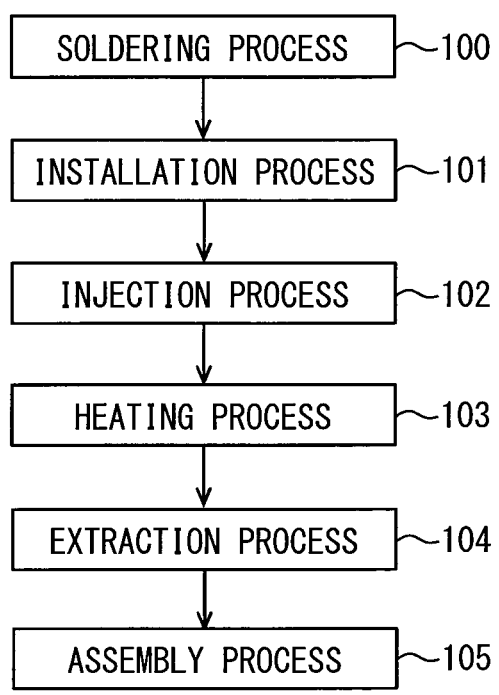
FIG. 7 is a flowchart of manufacturing steps of the position detector apparatus in the first embodiment of the present disclosure.

First, in a soldering process 100 shown in FIG. 7, the convex part 43 and the terminal 41 of the wiring 40 are connected by electric soldering. Further, the capacitor 42 is attached to the wiring 40.

Next, in an installation process 101, the detecting element 30, the wiring 40, and the terminal 41 are installed in an inside of the metal mold 60 used for injection molding.

Here, the metal mold 60 used for injection molding is described with reference to FIG. 5.

In the metal mold 60, a cavity is formed for infilling of the melted resin onto the one face 31 of the detecting element 30 and onto the four connecting faces connected to the four sides of the one face 31 as well as allowing an infill of the melted resin around the wiring 40 and the terminal 41. The detecting element 30 is put in the mold 60 with the other face 32 abutted onto an abutment part 61 of the metal mold 60. The abutment part 61 of the metal mold 60 is a part of an inner wall of the mold 60 on which the other face 32 of the detecting element 30 is abutted.

The metal mold 60 has a large capacity cavity 62 which forms a thick-wall part (i.e., a thick molded portion 51) of the resin part 50 positioned on the wiring side of the detecting element 30 as well as a small capacity cavity 63 which forms a thin-wall part (i.e., a thin molded portion 52) of the resin part 50 positioned on the opposite side (i.e., a side opposite to the wiring side) of the detecting element 30. Further, the metal mold 60 has a slope cavity 64 for forming the slope portion 53. This slope cavity 64 is a part of the large capacity cavity 62.

An injection passage 65 which injects melted resin into an inside of the metal mold 60 is disposed on a large volume cavity side of the metal mold 60.

Next, in an injection process 102, melted resin is injected into an inside of the metal mold 60 from the injection passage 65. At the injection time, melted resin flows into the large capacity cavity 62 from the injection passage 65, and flows therefrom into the small capacity cavity 63. At such time, as shown with an arrow F of FIG. 5, with the wall of the metal mold 60 which forms the slope cavity 64, melted resin flowing through the slope cavity 64 changes its flow direction, and applies pressure onto the one face 31 of the detecting element 30. Therefore, "floating up" of the detecting element 30 away from thee abutment part 61 of the metal mold 60 is prevented by the pressure, i.e., preventing melted resin from flowing into a position between the other face 32 of the detecting element 30 and the abutment part 61 of the metal mold 60. As a result, melted resin is injected and filled in an inside of the metal mold 60, with the position of the detecting element 30 being fixed at an intended position.

Then, in a heating process 103, the metal mold 60 is heated and thermosetting resin is hardened. Then, in an extraction process 104, the metal mold 60 is opened and the position detector apparatus 1 is picked up and removed from the metal mold 60. Thereby, the position detector apparatus 1 as a first pre-assembly module is completed.

Figure 6:
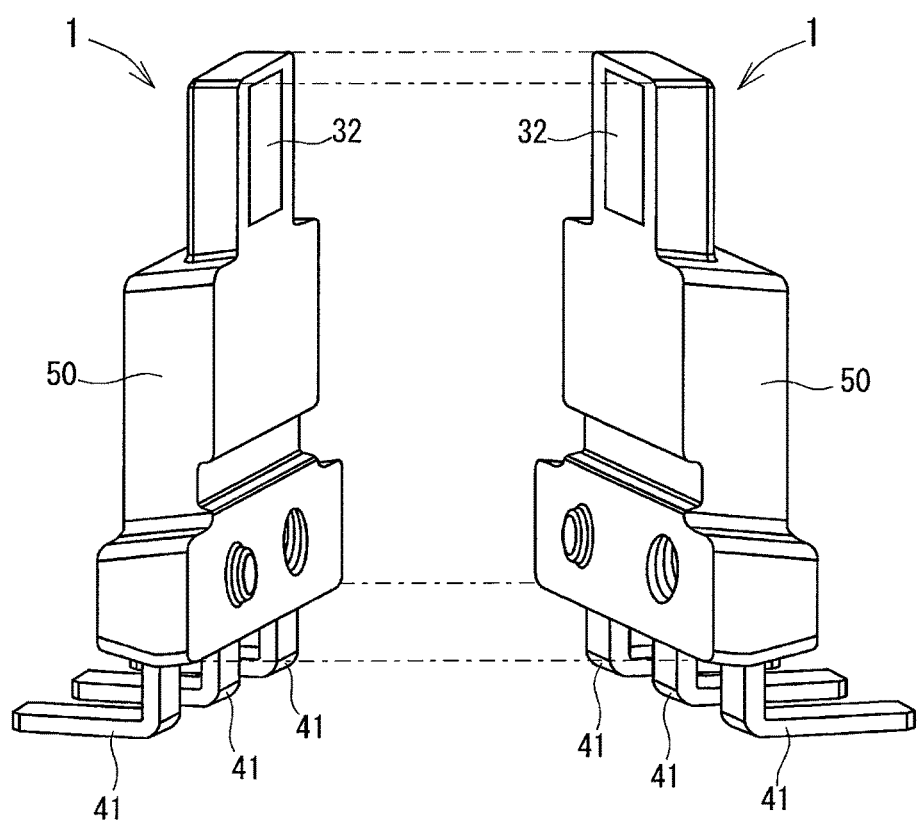
FIG. 6 is a pre-combination perspective view of two position detector apparatuses in the first embodiment of the present disclosure.

Next, in an assembly process 105, as shown in FIG. 6, two position detector apparatuses 1 are combined in a manner that respective other faces 32 of the two apparatuses 1 face each other. Then, by using a mold for molding a secondary pre-assembly module, which is not illustrated, the secondary pre-assembly module including two position detector apparatuses 1 and the housing cover 11 is formed.

Figure 11A:
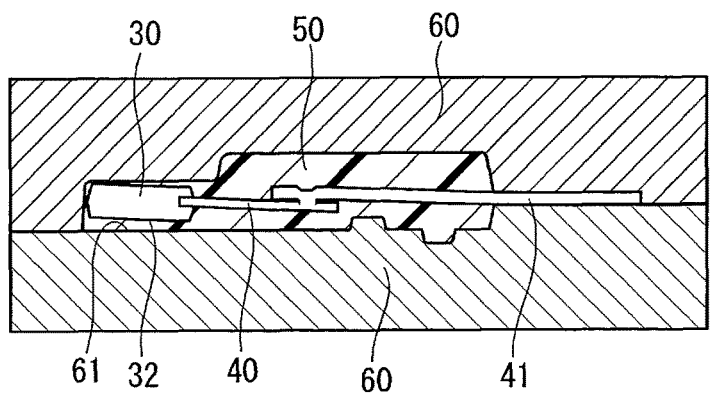
FIG. 11A is a cross section of an injection molding step for manufacturing a position detector apparatus in a comparative example.
Figure 11B:
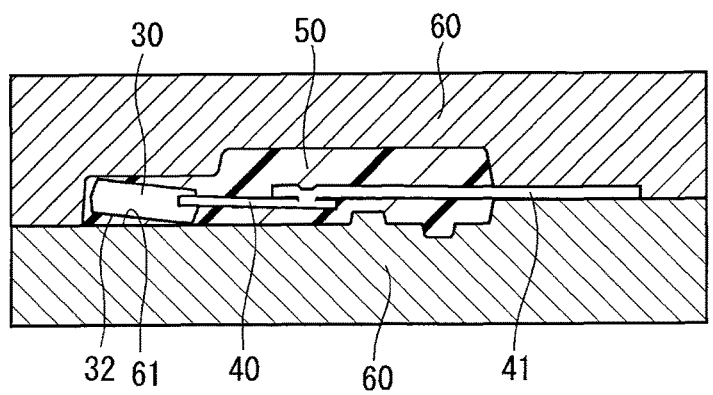
FIG. 11B is another cross section of an injection molding step for manufacturing a position detector apparatus in another comparative example.
Figure 11C:
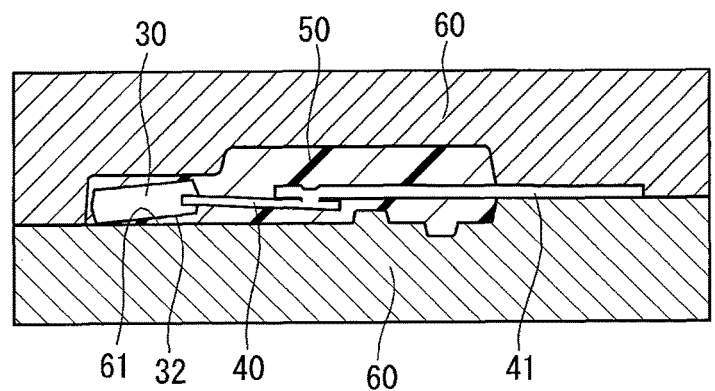
FIG. 11C is yet another cross section of an injection molding step for manufacturing a position detector apparatus in yet another comparative example.

Here, a position detector apparatus of a comparative example is shown in FIGS. 11A, 11B, and 11C.

In the position detector apparatus of a comparative example, the resin part 50 does not have the slope portion 53. Therefore, a thickness of the resin part 50 on the wiring side of the detecting element 30 and a thickness of the resin part on the opposite-to-wiring side of the detecting element 30 are the same.

In the position detector apparatus of a comparative example, when injection-molding the resin part 50, there is a possibility that melted resin may enter into a position between the other face 32 of the detecting element 30 and the abutment part 61 of the metal mold 60. FIGS. 11A, 11B, and 11C respectively show a floating state of the detecting element 30, i.e., the detecting element losing touch with the abutment part 61 of the metal mold 60. When melted resin hardens in such a state, the detecting element 30 is dislocated from an intended position.

On the other hand, the following effects are achieved in the first embodiment.

(1) According to the first embodiment, the resin part 50 has the slope portion 53, in which the thickness B of the resin part 50 on the opposite-to-wiring side of the detecting element 30 is thinner than the thickness A of the resin part 50 on the wiring side of the detecting element 30. Thereby, when injection-molding the resin part 50, the melted resin flowing from the wiring side of the detecting element 30 toward the opposite-to-wiring side applies pressure onto the one face 31 of the detecting element 30. Therefore, the other face 32 of the detecting element 30 is pressed against the metal mold 60, and the position of the detecting element 30 is fixed. Therefore, in the manufacturing process of the position detector apparatus 1, dislocation of the detecting element 30 is prevented.

(2) According to the first embodiment, the other face 32 of the detecting element 30 is exposed from the resin part 50.

Thereby, when injection-molding the resin part 50, the other face 32 of the detecting element 30 is abuttable to the metal mold 60. In such a case, the other face 32 of the detecting element 30 may be exposed from the resin part 50 at least partially, for the abutment to the metal mold 60.

(3) According to the first embodiment, the resin part 50 has the slope portion 53 that is formed as a slope, in which the slope extending from a connection part that connects the thick molded portion 51 and the thin molded portion 52 toward the opposite-to-wiring side has a thinning thickness of the slope portion 53, thinning toward the opposite-to-wiring side.

In such a structure, when the melted resin flows in the mold, i.e., in the slope portion 53 from the thick molded portion 51 toward the thin molded portion 52, during the injection molding of the resin part 50, the flow of the melted resin applies pressure on the one face 31 of the detecting element 30, and presses the other face 32 against the metal mold 60.

(4) According to the first embodiment, the connection part C where the slope portion 53 and the thin molded portion 52 are connected is positioned closer to a side opposite to the terminal than the terminal side of the detecting element 30.

In such a structure, when injection-molding the resin part 50, an application of pressure onto the one face 31 of the detecting element 30 from the melted resin flowing in the slope portion 53.

(5) According to the first embodiment, the slope portion 53 is right-left symmetric relative to the center axis O of the detecting element 30.

In such a structure, when injection-molding the resin part 50, the melted resin flowing through the slope portion 53 applies pressure evenly on the right side and on the left side of the detecting element 30. Therefore, dislocation of the detecting element 30 is prevented.

(6) According to the first embodiment, the detecting element 30 abuts the other face 32 onto the metal mold 60 at the time of injection molding.

By devising such a structure, when the pressure of the melted resin is applied on the one face 31 of the detecting element 30 during the injection molding of the resin part 50, it is possible to press the other face 32 of the detecting element 30 against the metal mold 60.

(7) According to the first embodiment, at the time of injection molding, the melted resin flows from the wiring side toward the opposite-to-wiring side of the detecting element 30, and then hardens to form the resin part 50.

In such manner, when injection-molding the resin part 50, the melted resin is enabled to apply pressure onto the one face 31 of the detecting element 30 because thickness of the resin part 50 is configured to be thinner from the wiring side toward the opposite-to-wiring side (i.e., a side opposite to the wiring side) of the detecting element 30.

(8) According to the first embodiment, the metal mold 60 used for the injection molding of the position detector apparatus 1 has (i) the large capacity cavity 62 which makes a part of the resin part 50 positioned on the wiring side of the detecting element 30 thicker as well as (ii) the small capacity cavity 63 which makes a part of the resin part 50 positioned on the opposite side (i.e., opposite-to-wiring side) of the detecting element 30 thinner. The large capacity cavity 62 has, as a part thereof, the slope cavity 64.

In such a structure, the melted resin which flows into the small capacity cavity 63 from the large capacity cavity 62 when injection molding the resin part 50 can apply pressure onto the one face 31 of the detecting element 30.

(9) According to the first embodiment, the metal mold 60 has the abutment part 61 which can abut on the other face 32 of the detecting element 30.

Therefore, when the pressure of the melted resin is applied on the one face 31 of the detecting element 30, the other face 32 of the detecting element 30 is pressed against the abutment part 61 of the metal mold 60, dislocation of the detecting element 30 away from an intended position is prevented.

(10) According to the first embodiment, as for the metal mold 60, the injection passage 65 for injecting the melted resin is disposed on the large volume cavity side of the surrounding space around the at least one face of the detector part and the wiring.

In such manner, flow of the melted resin from the large volume cavity side toward the small volume cavity side is enabled.

(11) According to the first embodiment, in the manufacturing method of the position detector apparatus 1, the melted resin is injected into an inside of the metal mold 60 so that the melted resin flows from the large volume cavity side toward the small volume cavity side.

Thereby, the pressure of the melted resin is applied on the one face 31 of the detecting element 30, and the other face 32 of the detecting element 30 is pressed against the metal mold 60. Therefore, dislocation of the detecting element 30 in an inside of the resin part 50 is prevented.

Second Embodiment

Figure 8:
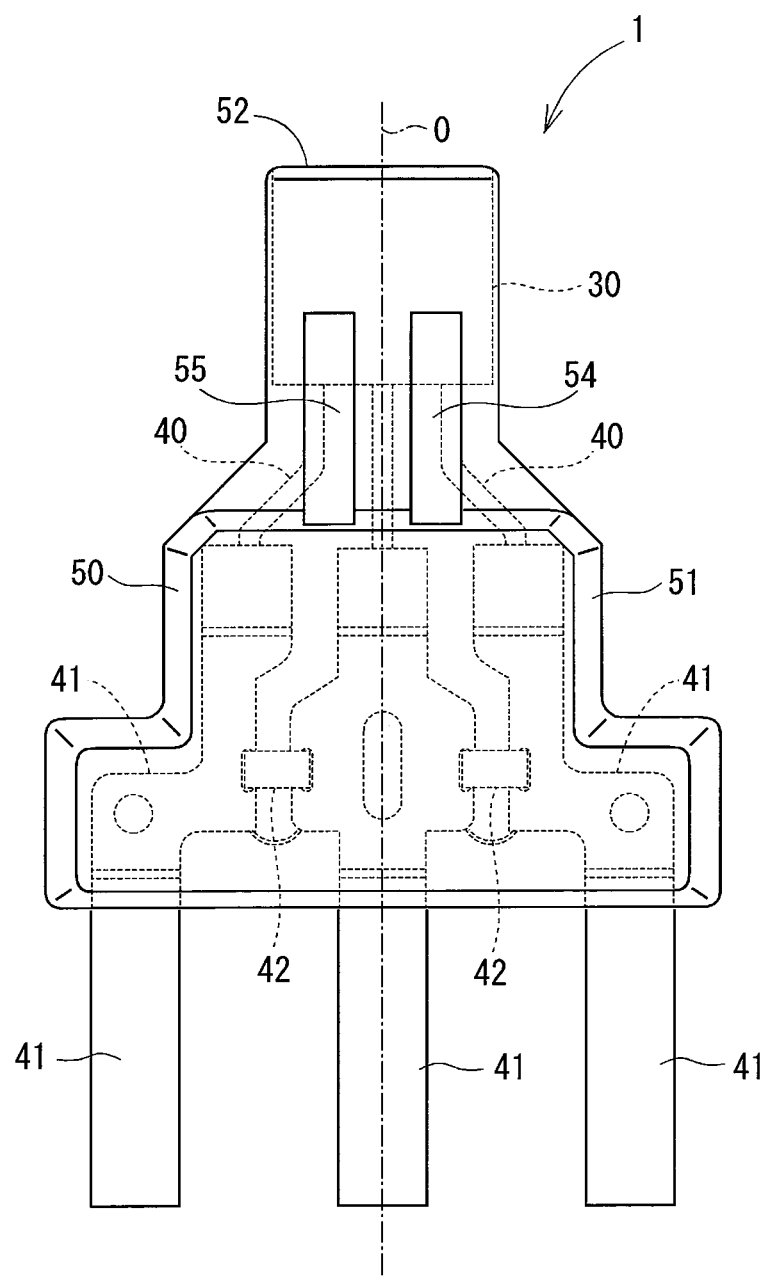
FIG. 8 is a plan view of the position detector apparatus in a second embodiment of the present disclosure.

The second embodiment of the present disclosure is described with reference to FIG. 8. In each of the following embodiments, like parts have like numbers as the first embodiment, and description about the like parts is saved.

According to the second embodiment, the resin part 50 of the position detector apparatus 1 has two or more slope parts 54 and 55 symmetrically on both sides of the center axis O of the detecting element 30. The slope section 54 and the slope section 55 have the same size and the same shape.

According to the second embodiment, in addition to the same effect as the first embodiment mentioned above, the following effects are also achieved.

In the second embodiment, the position of the slope part may be farther to the right and left away from the center axis O of the detecting element 30 compared with the slope part in the first embodiment. Thereby, when injection-molding the resin part 50, the melted resin flowing through the two slope parts 54 and 55 applies pressure evenly on the right and left of the one face 31 of the detecting element 30. Therefore, it is possible to securely press the other face 32 of the detecting element 30 against the abutment part 61 of the metal mold 60. Therefore, dislocation of the detecting element 30 is securely prevented.

Third Embodiment

Figure 9:
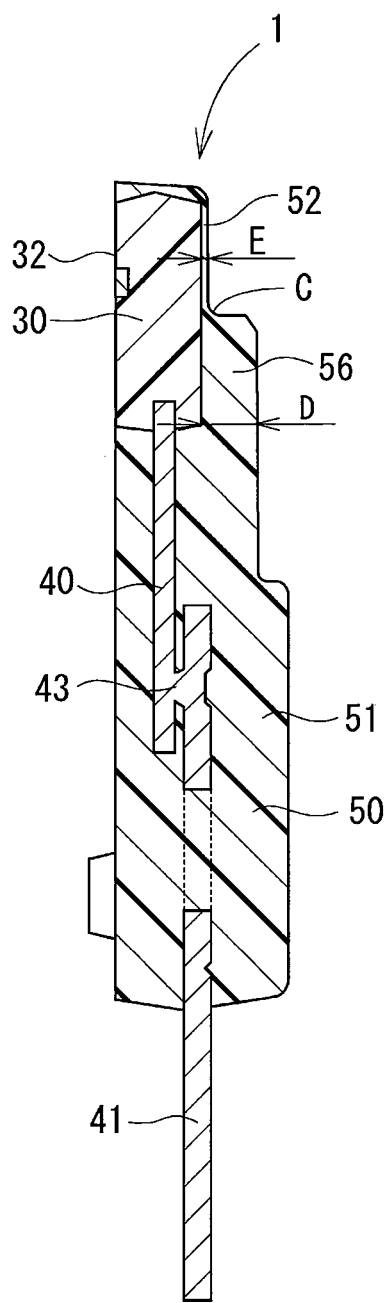
FIG. 9 is a cross section of the position detector apparatus in a third embodiment of the present disclosure.
Figure 10:
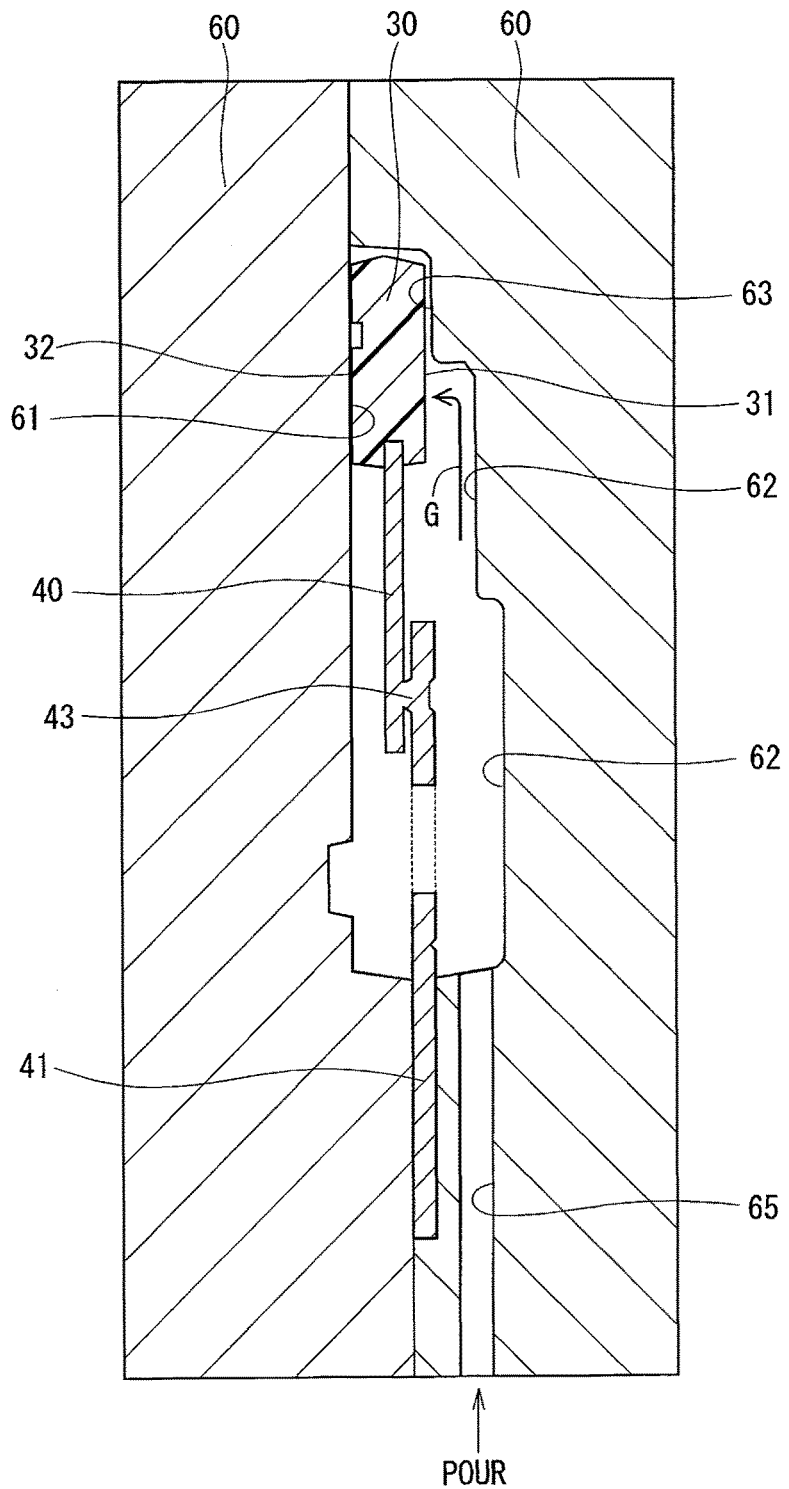
FIG. 10 is a cross section of the metal mold used for an injection molding of the position detector apparatus in the third embodiment of the present disclosure.

The third embodiment of the present disclosure is described with reference to FIGS. 9 and 10.

According to the third embodiment, the resin part 50 of the position detector apparatus 1 does not have a slope part. Instead, the resin part 50 has an extending part 56 extending toward the thin molded portion 52 from the thick molded portion 51. A connection part C between the extending part 56 and the thin molded portion 52 is positioned above the detecting element 30. Therefore, in the third embodiment, the thin molded portion 52 and the extending part 56 thicker than the thin molded portion 52 are both positioned above the one face 31 of the detecting element 30. Further, the extending part 56 is symmetrically formed on both sides of the center axis O of the detecting element 30.

Also in the third embodiment, a thickness E of the thin molded portion 52 positioned on the opposite-to-wiring side of the detecting element 30 is thinner than a thickness D of the extending part 56 positioned on the wiring side of the detecting element 30. Therefore, as shown in FIG. 10, when injection-molding the resin part 50, the melted resin injected into an inside of the metal mold 60 from the injection passage 65 changes a flow direction according to a wall of the metal mold 60 for molding the extending part 56, and applies pressure onto the one face 31 of the detecting element 30. Therefore, the other face 32 of the detecting element 30 is pressed against the abutment part 61 of the metal mold 60, and a floating up of the element 30 away from the abutment part 61 is prevented. Therefore, the melted resin is filled up in an inside of the metal mold 60 with the position of the detecting element 30 being fixed at a desired place. Also in the third embodiment, the same effects as the first and second embodiments mentioned above are achieved.

Fourth Embodiment

The position detector apparatus in one embodiment of the present disclosure is shown in FIGS. 12 to 19.

The position detector apparatus 101 of the present embodiment is built into a housing cover 111 of an electronically-controlled throttle 110 which controls an amount of air volume inhaled into a cylinder of a vehicle engine.

The outline configuration of the electronically-controlled throttle 110 is described.

Figure 12:
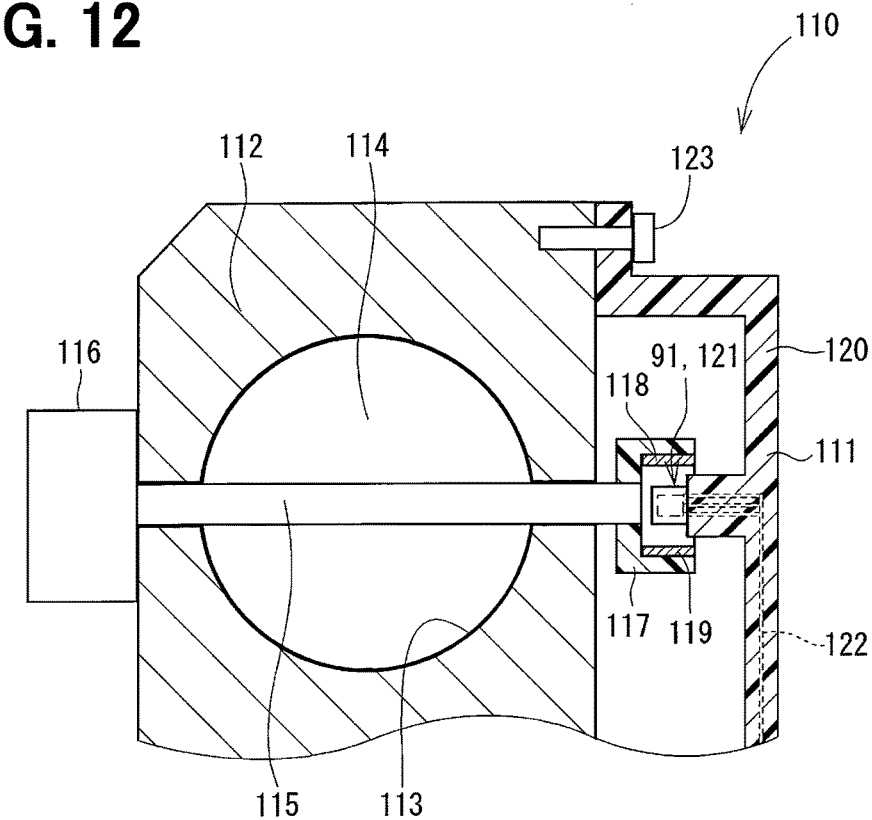
FIG. 12 is a cross section of an electric-control throttle apparatus having a position detector apparatus in a fourth embodiment of the present disclosure.

As shown in FIG. 12, the structure of the electronically-controlled throttle 10 is substantially same as the one in the first embodiment.

The housing cover 111 is attached on a holder side of the housing 112 by using a screw 123.

Figure 13:
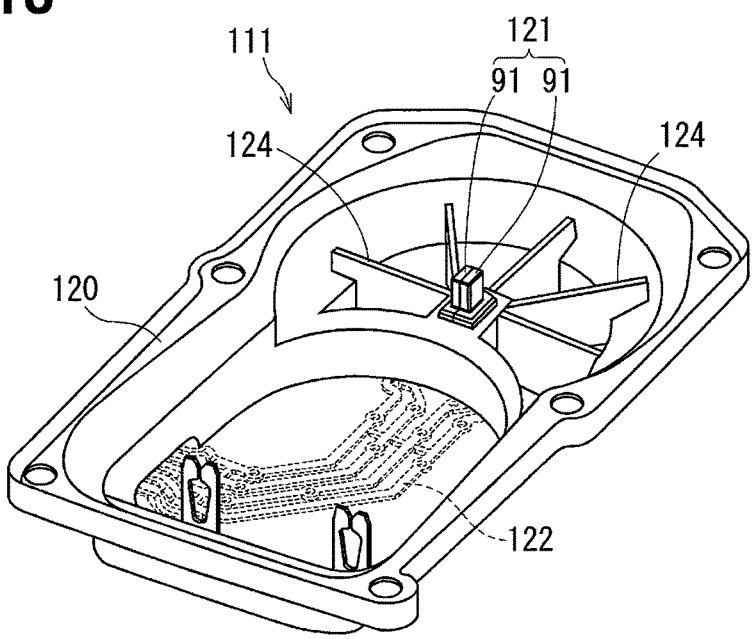
FIG. 13 is a perspective view of a housing cover of the electric-control throttle apparatus having the position detector apparatus in the fourth embodiment of the present disclosure.

As shown in FIGS. 12 and 13, the housing cover 111 is formed in a dish shape with resin, and has a cover body 120, a rotational angle sensor 121, a connector wiring 122, and the like. The rotational angle sensor 121 of the present embodiment is a combination of two position detector apparatuses 11 which are respectively a first pre-assembly module. The cover body 120 is a secondary pre-assembly module that molds, as one body, two position detector apparatuses 11 and the connector wiring 122 with resin. The housing cover 111 has plural ribs 124 for improving rigidity.

The position detector apparatus 11 is disposed in the magnetic field that is generated in an inside of the holder 117, and outputs a voltage signal according to the density of the magnetic flux which is caused by the in-holder magnetic field and which passes through the position detector apparatus 11. This signal is transmitted to ECU through the connector wiring 122. ECU performs drive control of the motor 116 according to the signal from the position detector apparatus 11, and also controls each of many parts in the vehicle.

Next, the position detector apparatus 11 is described with reference to FIG. 14 to FIG. 16. FIG. 16 in this case illustrates the position detector apparatus 11 in a state in which a resin body 160 is not yet molded thereon.

The position detector apparatus 11 includes a detector part 130, a terminal 150, and the resin body 160 together with other parts.

The detector part 130 is a Hall IC, for example, and has a semiconductor element 131 such as a Hall element, a lead frame 140 on which the semiconductor element 131 is disposed, and a resin frame 132 which molds the semiconductor element 131 and at least a part of the lead frame 140.

As shown in FIG. 16, the lead frame 140 comprises a first lead frame 141, a second lead frame 142, and a third lead frame 143. The first lead frame 141 positioned at the center has an outer lead portion 144 located on the outside of the resin frame 132, a die-pad portion 145 extending from the outer lead portion 144 toward an inside of the resin frame 132, and a die-bar portion 146 extending from the die-pad portion 145 in a direction that is different from the outer lead portion 144.

The die-pad portion 145 has the semiconductor element 131 installed thereon. The second lead frame 142 and the third lead frame 143 are electrically connected to the die-pad portion 145 by a bonding wire 147, respectively.

The die-bar portion 146 is exposed from the resin frame 132 at a different position that is different from a position where the outer lead portion 144 projects from the resin frame 132. A part of the die-bar portion 146 exposed from the resin frame 132 serves as exposed metal portions 148 and 149.

The exposed metal portions 148 and 149 are used to prevent a dislocation of the lead frame 140 in an inside of the non-illustrated injection-molding mold when the semiconductor element 131 and a part of the lead frame 140 are molded by the resin frame 132. That is, when the resin frame 132 is injection-molded, the outer lead portion 144 of the lead frame 140 and the exposed metal portions 148 and 149 are fixedly held before the resin is injected into the mold. In such manner, the detector part 130 has an accurately-positioned semiconductor element 131, that is, the position of the semiconductor element 131, which is installed on the lead frame 140 in an inside of the resin frame 132, is correctly set.

Figure 14:
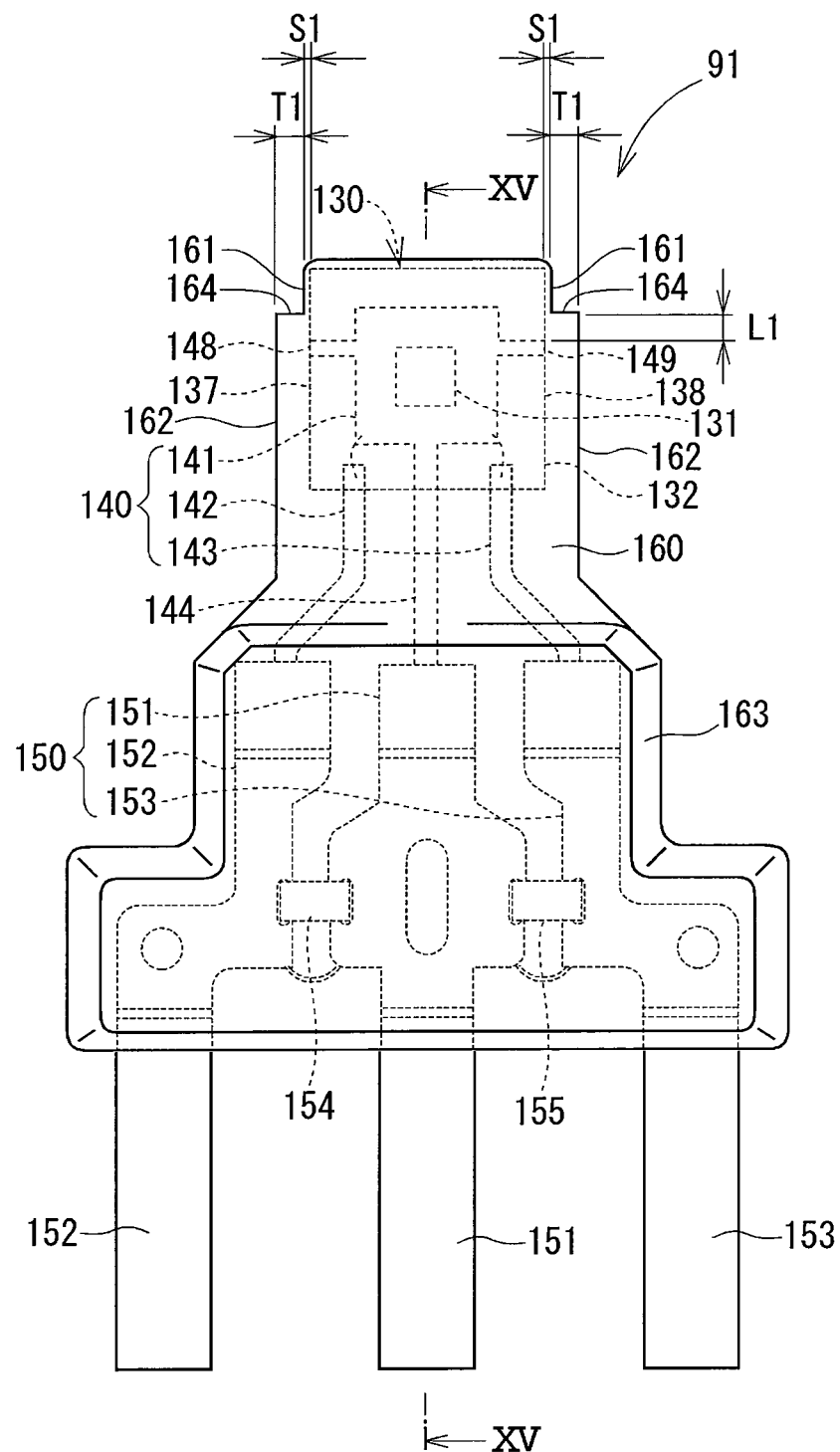
FIG. 14 is a plan view of the position detector apparatus in the fourth embodiment of the present disclosure.
Figure 15:
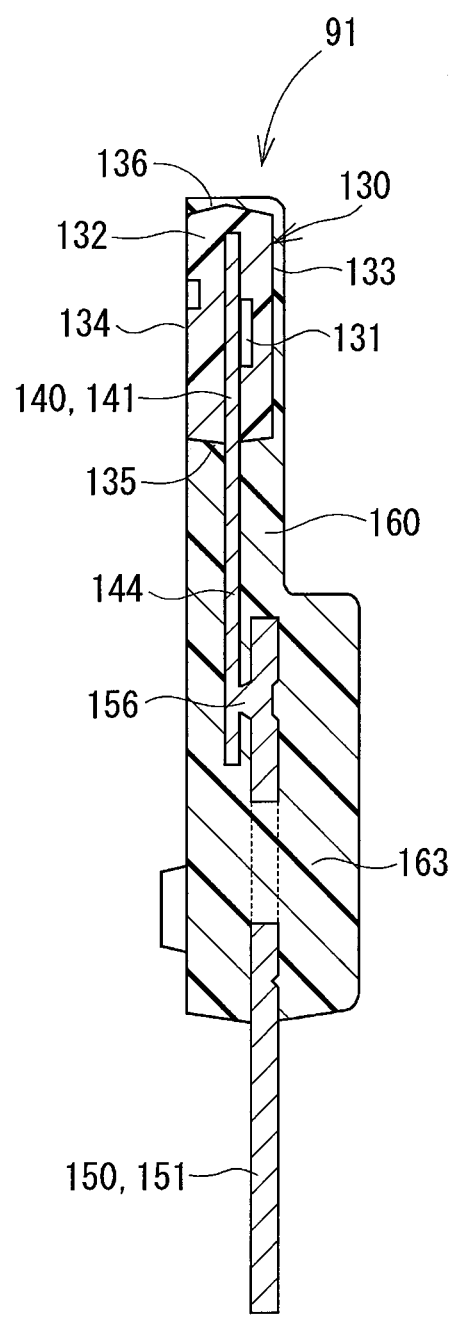
FIG. 15 is a cross section of the position detector apparatus along a XV-XV line in FIG. 14.
Figure 16:
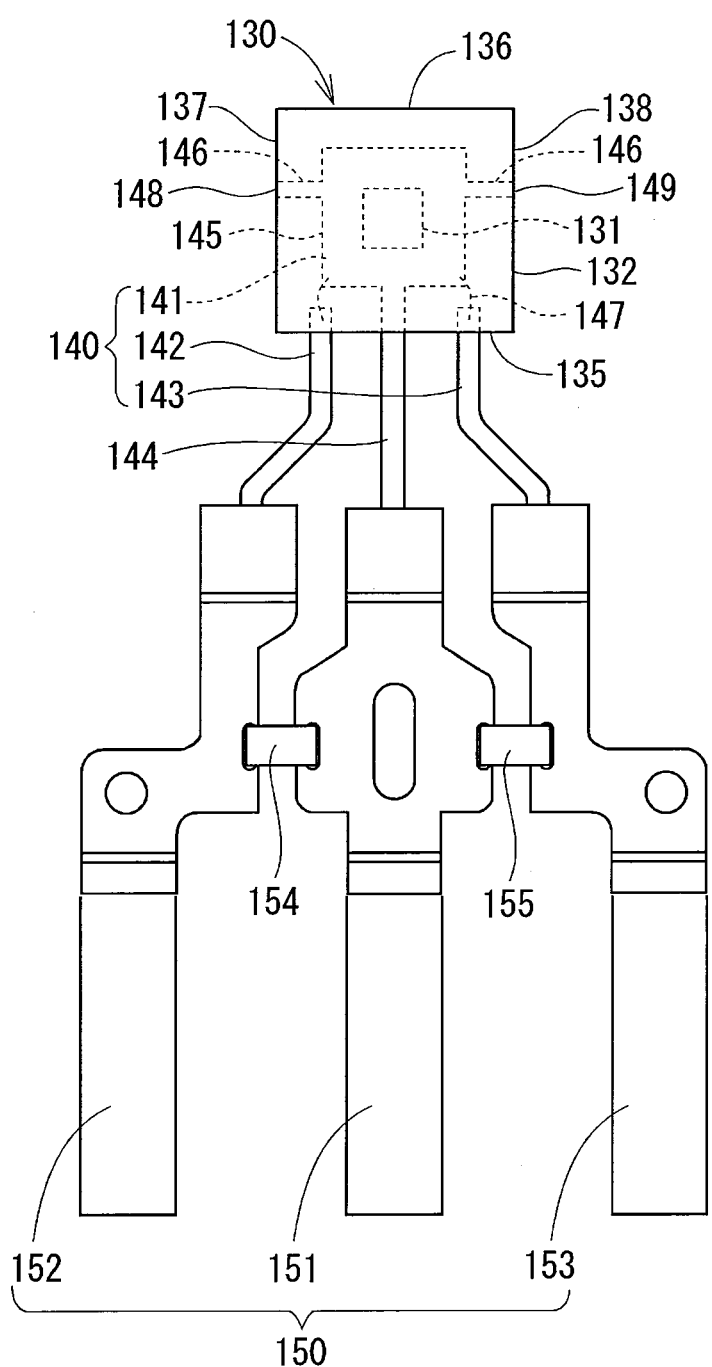
FIG. 16 is a resin-stripped plan view of the position detector apparatus in the fourth embodiment of the present disclosure, in which a resin body is removed from the position detector apparatus.

As shown in FIGS. 14 and 15, the resin frame 132 has an first face 133 and a second face 134 in parallel with the lead frame 140, a third face 135 on a lead frame projecting side, a fourth face 136 on an opposite side of the third face 135, a fifth face 137 and a sixth face 138 that respectively connect the first face 133 and the second face 134.

Two exposed metal portions 148 and 149 are disposed on the fifth face 137 and the fifth face 138 of the resin frame 132, respectively.

The terminal 150 comprises a first terminal 151, a second terminal 152, and a third terminal 153. The first terminal 151 has a convex part 156 on one end, i.e., on a detecting part side end, which is electric-soldered onto the first lead frame 141, and an opposite end extending out from the resin body 160. Similarly, in the second and third terminals 152 and 153, detecting part side ends are electric-soldered onto the second and third lead frames 142, 143, and opposite ends extending out from the resin body 160. The first to third terminals 151, 152, 153 have, respectively, the opposite ends that are electric-soldered to the connector wiring 122 of the housing cover 111 mentioned above. Further, chip capacitors 154 and 155 are disposed at a position between the first terminal 151 and the second terminal 152 and at a position between the first terminal 151 and the third terminal 153, respectively.

The resin body 160 molds the detector part 130 and a part of the terminal 150.

The resin body 160 of the present embodiment has a thin-resin portion 161 which molds a side opposite to the terminal end of the detector part 130, a thick-resin portion 162 which molds a terminal end of the detector part 130 (i.e., the terminal end of the detector part 130 is next to a portion of the detector part 130 molded by the thin-resin portion 161), and a resin body portion 163 which molds a further terminal side (i.e., the further terminal side is a portion of the terminal 150 molded to make a resin frame). The thin-resin portion 161 and the thick-resin portion 162 are disposed at least on the fifth face 137 and the fifth face 138 of the resin frame 132.

The thin-resin portion 161 is disposed on the side opposite to the terminal of the exposed metal portions 148 and 149. The thin-resin portion 161 is set to have a very thin wall, which is defined by a thickness S1, and, with such a thickness S1 of the thin-resin portion 161, the detector part 130 is prevented from being exposed from the wall, i.e., from the thin-resin portion 161, even when a predetermined amount of dislocation of the detector part 130 is caused by the tolerance of the dimension of the detector part 130. Further, even when the detector part 130 is exposed from the wall by the predetermined amount of dislocation of the detector part 130 within an allowable tolerance of the detector part 130, the degree of dislocation is set to control an error of the detection accuracy of the position detector apparatus 91 to be contained within an allowable range (i.e., within a tolerance).

The thick-resin portion 162, being disposed on the terminal side of the thin-resin portion 161, covers the exposed metal portions 148 and 149. A thickness T1 of the thick-resin portion 162 is thicker than the thickness S1 of the thin-resin portion 161. Therefore, a level difference 164 is made at a connection part between the thin-resin portion 161 and the thick-resin portion 162. A predetermined distance L1 is provided between the level difference 64 and exposed metal portions 148 and 149. This predetermined distance L1 is larger than zero. Thereby, the exposed metal portions 148 and 149 are securely covered with the thick-resin portion 162. Therefore, even when the detector part 130 is exposed from the thin-resin portion 161, the thick-resin portion 162 prevents intrusion of water to the exposed metal portions 148 and 149, to the lead frame 140, and to the terminal 150.

Figure 17:
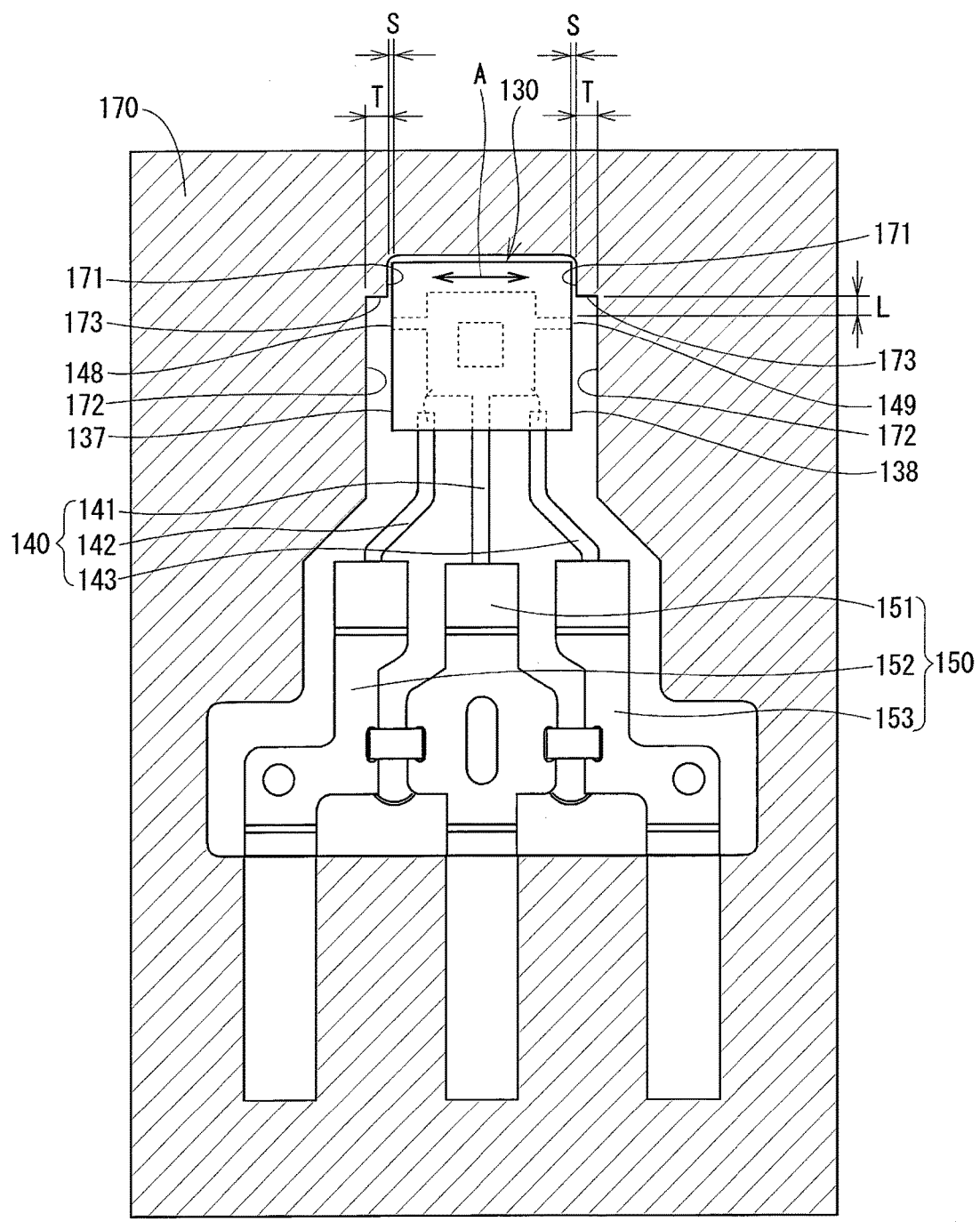
FIG. 17 is a cross section of a metal mold for injection molding of the position detector apparatus in the fourth embodiment of the present disclosure.

FIG. 17 shows an illustration of the detector part 130 and the terminal 150 disposed in an inside of a metal mold 170 used for the injection molding of the resin body 160.

A gap space S between an inner wall 171 of the metal mold 170 and the detector part 130 which forms the thin-resin portion 161 corresponds to the thickness S1 of the thin-resin portion 161. That is, as shown by an arrow A, the gap space S is defined to have a certain distance, which does not allow a contact of the detector part 130 with the inner wall 171 of the metal mold 170, even when the tolerance of the dimension of the detector part 130 causes a dislocation of the detector part 130. Further, even if the detector part 130 contacts the inner wall 171 of the metal mold 170 due to the larger dislocation tolerance of the detector part 130, the gap space S is set to control an error of the detection accuracy of the position detector apparatus 91 to be within an allowable range (i.e., within a tolerance).

A gap space T between an inner wall 172 of the metal mold 170 and the detector part 130 which form the thick-resin portion 162 corresponds to the thickness T1 of the thick-resin portion 162. Further, a distance L between (i) an inner wall 173 of the metal mold 170, which forms the level difference 164 between the thin-resin portion 161 and the thick-resin portion 162, and (ii) the exposed metal portions 148 and 149 corresponds to the distance L1 between the level difference 164 and the exposed metal portions 148 and 149. That is, the thick-resin portion 162 molded by this metal mold 170 can securely cover the exposed metal portions 148 and 149.

After injecting the melted thermosetting resin or the melted thermoplastics into an inside of the metal mold 170 shown in FIG. 17 and hardening the injected resin, the position detector apparatus 91 is picked up from the metal mold 170. Thereby, the position detector apparatus 91 is prepared as a first pre-assembly molding module.

Figure 18:
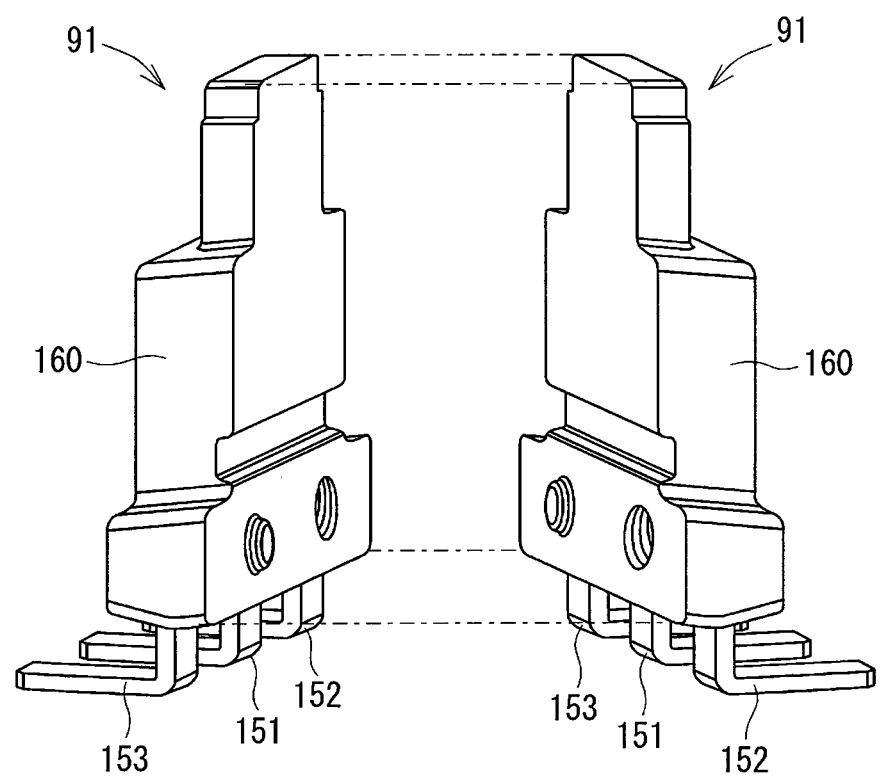
FIG. 18 is a pre-combination perspective view of two position detector apparatuses in the fourth embodiment of the present disclosure.

Then, as shown in FIG. 18, two position detector apparatuses 91 are assembled to face each other, and, by using a secondary pre-assembly metal mold 170 (not illustrated), a combination of the two position detector apparatuses 91 is molded together with the housing cover 111 to have a one-body secondary pre-assembly molding module.

Here, the position detector apparatus of a comparative example is described.

Figure 19:
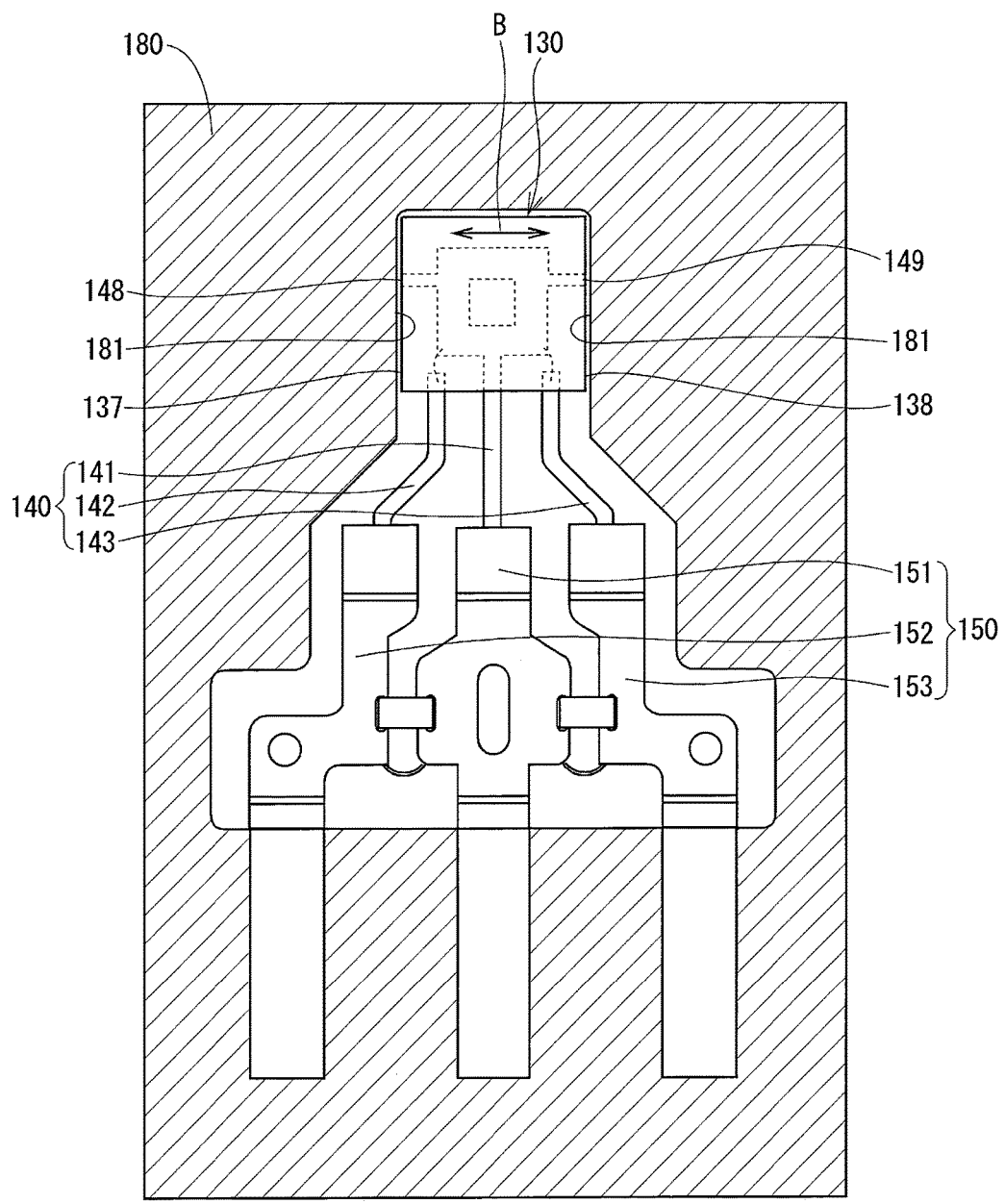
FIG. 19 is a cross section of the metal mold for injection molding of the position detector apparatus in a comparative example.

FIG. 19 shows an illustration of the detector part 130 and the terminal 150 disposed in an inside of a metal mold 180 used for the injection molding of the resin body of a comparative-example's position detector apparatus.

As for the position detector apparatus of a comparative example, the resin body does not have a thick-resin portion. Therefore, an inner wall 181 of the metal mold 180 around the detector part 130 is positioned next to the detector part 130, preventing the dislocation of the detector part 130. In this case, if the dislocation of the detector part 130 is caused in an inside of the metal mold 180 and the detector part 130 comes close to or contacts the inner wall 181 of metal mold 180 as shown by an arrow B, it is suspected that the detector part 130 may be exposed from the resin body. When water etc. intrudes from an exposure part at which the detector part 130 exposed from the molding resin and causes corrosion of the exposed metal portions 148, 149, the lead frame 140, or the terminal 150, the detecting accuracy of the position detector apparatus may deteriorate.

On the other hand, the position detector apparatus 1 of the present embodiment achieved the following effects.

(1) According to the present embodiment, the resin body 160 has the thin-resin portion 161 which molds the a side opposite to the terminal end of the detector part 130, and the thick-resin portion 162 which molds the terminal end of the detector part 130 (i.e., the terminal end of the detector part 130 is next to a portion of the detector part 130 molded by the thin-resin portion 161).

Thereby, the position detector apparatus 91 is enabled to have the position error (i.e., dislocation) of the detector part 130 in an inside of the thin-resin portion to be contained in an allowable range. Further, even when the detector part 130 is exposed from the thin-resin portion 161, the position detector apparatus 91 prevents an intrusion of water etc. into the exposed metal portions 148, 149, the lead frame 140, or the terminal 150 by the thick-resin portion 162. Therefore, the position detector apparatus 91 has improved detection accuracy.

(2) In the present embodiment, the thin-resin portion 161 is configured to have a thickness which is within an allowable tolerance of the detector part 130.

In such manner, even when the detector part 130 molded with the resin body 160 has a position error (i.e., dislocation), the detector part 130 abuts on the inner wall 171 of the metal mold 170 which molds the resin body 160. Therefore, the degree of dislocation of the detector part 130 is controlled to be in the allowable range (i.e., within a predetermined amount of allowable dislocation).

(3) In the present embodiment, the thin-resin portion 161 is configured to have a thickness which prevents an exposure of the detector part 130 when the dislocation of the detector part 130 is within the tolerance (i.e., within a predetermined amount of allowable dislocation).

Thereby, an exposure of the detector part 130 from the thin-resin portion 161 is prevented. Therefore, an intrusion of water etc. into an inside of the resin body 160 is prevented.

(4) According to the present embodiment, the thin-resin portion 161 is disposed on a side opposite to the terminal of the exposed metal portions 148 and 149 in the detector part 130. The thick-resin portion 162, being disposed on the terminal side of the thin-resin portion 161, covers the exposed metal portions 148 and 149.

In such manner, even when the detector part 130 is exposed from the thin-resin portion 161, an exposure of the exposed metal portions 148 and 149 from the thick-resin portion 162 is prevented. Therefore, in addition to a prevention of the corrosion of the exposed metal portions 148 and 149, an intrusion of water etc. from the exposed metal portions 148 and 149 into an inside of the resin frame 132 is prevented. Therefore, the detection accuracy of the position detector apparatus 91 is maintained unchanged.

(5) According to the present embodiment, the thin-resin portion 161 and the thick-resin portion 162 are disposed on the fifth face 137 and the fifth face 138 of the resin frame 132 in the detector part 130.

Thereby, when the exposed metal portions 148 and 149 are disposed on each of the fifth face 137 and the fifth face 138 of the resin frame 132, the thick-resin portion 162 prevents an exposure of the exposed metal portions 148 and 149. Further, the thin-resin portion 161 controls the degree of right-left dislocation of the detector part 130 to be within the allowable range (i.e., within the tolerance).

Other Embodiments (1) The position detector apparatus which constitutes a rotational angle sensor of an electronically controlled throttle apparatus used in a vehicle is described in the above embodiment.

On the other hand, a position detector apparatus in other embodiments may be usable in various products. For example, the position detector apparatus may detect a rotation angle of an accelerator pedal. The position detector apparatus may detect a rotation angle of a tumble control valve. Further, the position detector apparatus may be a stroke sensor which detects a stroke amount of a clutch actuator.

(2) In the embodiment mentioned above, a Hall element is described as an example of a magnetism detecting element in the detecting part. On the other hand, in other embodiments, the magnetism detecting element may be implemented as various sensing elements, such as an MR element and the like.

(3) In the embodiments mentioned above, the rotational angle sensor is implemented as a combination of two position detector apparatuses. On the other hand, only one position detector apparatus may constitute a rotational angle sensor in other embodiments.

(4) According to the first to third embodiments mentioned above, the resin part of the position detector apparatus is formed with the thermosetting resin. On the other hand, in other embodiments, the resin part of the position detector apparatus may be formed with thermoplastics.

(5) In the embodiment mentioned above, the thin-resin portion and the thick-resin portion are provided on the fifth face and sixth face of the resin frame. On the other hand, in other embodiments, if the exposed metal portion is provided on the first face and the second face of the resin frame, the thin-resin portion and the thick-resin portion may be provided on the first face and the second face of the resin frame.

(6) In the embodiment mentioned above, the resin frame has the exposed metal portion.

On the other hand, in other embodiments, the resin frame may be dispensed with the exposed metal portion. Even in such case, the thin-resin portion can control/suppress the dislocation of the detecting part within the tolerance, and the thick-resin portion can effectively prevent intrusion of water etc. to reach the lead frame and/or the terminal.

Although the present disclosure has been fully described in connection with preferred embodiment thereof with reference to the accompanying drawings, it is to be noted that various changes and modifications will become apparent to those skilled in the art, and such changes, modifications, and summarized schemes are to be understood as being within the scope of the present disclosure as defined by appended claims.

What is claimed is:
1. A position detector apparatus comprising:
a magnetic detecting element, the magnetic detecting element having a first magnetic detecting face and a second magnetic detecting face;
wiring extending from the magnetic detecting element; and
a resin part having a thick molded portion, a thin molded portion, and a slope portion, wherein
a thickness of the resin part at a wiring side portion on the at least one face of the magnetic detecting element is greater than a thickness of the resin part on a side opposite to the wiring side portion on the at least one face of the magnetic detecting element,
the resin part contacts and covers the first magnetic detecting face and the wiring,
a first portion of the first magnetic detecting face is covered by the thin molded portion of the resin part, and a second portion of the first magnetic detecting face is covered by the slope portion of the resin part, a first portion of the wiring is covered by the slope portion of the resin part, and a second portion of the wiring is covered by the thick molded portion of the resin part, the thin molded portion is connected to the thick molded portion via the slope portion, the thin molded portion is connected to the slope portion at a first connection part, and the slope portion is connected to the thick molded portion at a second connection part, and a thickness of the slope portion increases from the first connection part to the second connection part.

2. The position detector apparatus of claim 1, wherein the second magnetic detecting face is at least partially exposed from the resin part.

3. The position detector apparatus of claim 1, further comprising a terminal in connection with the wiring, a portion of the terminal surrounded by the thick molded portion and a portion of the terminal exposed from the resin part, wherein the first connection part is positioned at a side opposite to the terminal.

4. The position detector apparatus of claim 1, wherein the slope portion is symmetric relative to a center axis of the magnetic detecting element.

5. The position detector apparatus of claim 2, wherein the second magnetic detecting face is exposed from the resin part and abuttable with a metal mold used to injection mold the resin part.

6. The position detector apparatus of claim 1, wherein the resin part is formed by injection molding a melted resin from a wiring side portion of the magnetic detecting element, the wiring side portion at a position furthest from the magnetic detecting element.

7. A position detector apparatus comprising:
a detector part including:
a lead frame having a semiconductor element disposed thereon, and
a resin frame molding together the semiconductor element and a part of the lead frame;

a terminal connected to an end of the lead frame and protruding from the resin frame of the detector part; and a resin body having a thin-resin portion, a thick-resin portion, and a slope portion, wherein the semiconductor element includes a face configured to allow passage of a magnetic flux therethrough for detection by the semiconductor element, a first portion of the face is covered by the thin-resin portion and a second portion of the face is covered by the slope portion, and one portion of the terminal is surrounded by the thick-resin portion and another portion of the terminal is exposed from the resin body.

8. The position detector apparatus of claim 7, wherein the thin-resin portion has a thickness that allows a predetermined amount of dislocation of the detector part.

9. The position detector apparatus of claim 7, wherein the thin-resin portion has a thickness that prevents exposure of the detector part when a position of the detector part is dislocated by the predetermined amount of dislocation.

10. The position detector apparatus of claim 7, wherein the detector part has an exposed metal portion that is set at a position that is different from a partially-exposed position of the lead frame, the thin-resin portion is positioned further away from terminal end than the exposed metal portion, and the thick-resin portion is positioned on the terminal end of the detector part and covers the exposed metal portion.

11. The position detector apparatus of claim 10, wherein the resin frame of the detector part has a first face and a second face respectively disposed in parallel with the lead frame, a third face that is positioned on a lead frame projecting side, a fourth face that is positioned on a side opposite to the third face, and a fifth face and a sixth face that respectively connect the first face and the second face and have the exposed metal portion positioned thereon, and the thin-resin part and the thick-resin part are disposed on the fifth face and on the sixth face.

\* \* \* \* \*